US011165897B2

(12) United States Patent
Song et al.

(10) Patent No.: US 11,165,897 B2
(45) Date of Patent: *Nov. 2, 2021

(54) ROLL-SLIDE MOBILE TERMINAL

(71) Applicant: LG ELECTRONICS INC., Seoul (KR)

(72) Inventors: Insu Song, Seoul (KR); Jaewook Lee, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/422,808

(22) Filed: May 24, 2019

(65) Prior Publication Data

US 2020/0267246 A1 Aug. 20, 2020

Related U.S. Application Data

(60) Provisional application No. 62/805,920, filed on Feb. 14, 2019.

(30) Foreign Application Priority Data

Apr. 5, 2019 (KR) .................. 10-2019-0040329

(51) Int. Cl.
*H04M 1/02* (2006.01)
*H05K 1/14* (2006.01)
*G06F 1/16* (2006.01)

(52) U.S. Cl.
CPC ........ *H04M 1/0268* (2013.01); *G06F 1/1652* (2013.01); *H04M 1/0239* (2013.01); *H05K 1/148* (2013.01)

(58) Field of Classification Search
CPC ............. H04M 1/0268; H04M 1/0239; H04M 1/0237; G06F 1/1652; G06F 1/1624; G06F 1/1622; H05K 1/148
See application file for complete search history.

(56) References Cited

U.S. PATENT DOCUMENTS

| 2005/0009572 A1* | 1/2005 | Ahn ................. H04M 1/0237 455/566 |
| 2010/0246113 A1* | 9/2010 | Visser ................ G06F 1/1601 361/679.3 |

(Continued)

FOREIGN PATENT DOCUMENTS

| CN | 102902308 | 1/2013 |
| CN | 106884867 | 6/2017 |

(Continued)

OTHER PUBLICATIONS

PCT International Application No. PCT/KR2019/007094, Written Opinion of the International Searching Authority dated Nov. 14, 2019, 13 pages.

(Continued)

*Primary Examiner* — Yuwen Pan
*Assistant Examiner* — Fatuma G Sherif
(74) *Attorney, Agent, or Firm* — Lee, Hong, Degerman, Kang & Waimey

(57) ABSTRACT

A mobile terminal is disclosed including a first frame, a second frame slidable with respect to the first frame between a first position and a second position, a third frame at a rear side and configured to be slidable with respect to the second frame between a third position and a fourth position, a flexible display unit including a first area, a second area, and a third area, and a sliding unit configured to allow the second frame to slide between the first position and the second position and the third frame to slide between the third position and the fourth position, wherein an area of the third area visible from a front side increases as the second frame slides from the first position to the second position and the third frame slides from the third position to the fourth position.

25 Claims, 11 Drawing Sheets

(56) References Cited

U.S. PATENT DOCUMENTS

| | | | |
|---|---|---|---|
| 2012/0139815 A1* | 6/2012 | Aono | G06F 1/1616 |
| | | | 345/1.3 |
| 2014/0211399 A1 | 7/2014 | O'Brien | |
| 2015/0241927 A1 | 8/2015 | Ryu et al. | |
| 2016/0147261 A1 | 5/2016 | Bohn et al. | |
| 2017/0038798 A1* | 2/2017 | Lee | G06F 1/1616 |
| 2017/0139442 A1* | 5/2017 | Yoshizumi | G06F 1/1641 |
| 2017/0310799 A1* | 10/2017 | Lin | G06F 1/1652 |
| 2018/0014417 A1 | 1/2018 | Seo et al. | |
| 2018/0103550 A1 | 4/2018 | Seo et al. | |
| 2018/0103552 A1 | 4/2018 | Seo et al. | |

FOREIGN PATENT DOCUMENTS

| | | |
|---|---|---|
| CN | 107818735 | 3/2018 |
| CN | 107919065 | 4/2018 |
| CN | 108259649 | 7/2018 |

OTHER PUBLICATIONS

The State Intellectual Property Office of the People's Republic of China Application Serial No. 201910708947.0, Office Action dated Jan. 22, 2021, 13 pages.

\* cited by examiner

FIG. 2
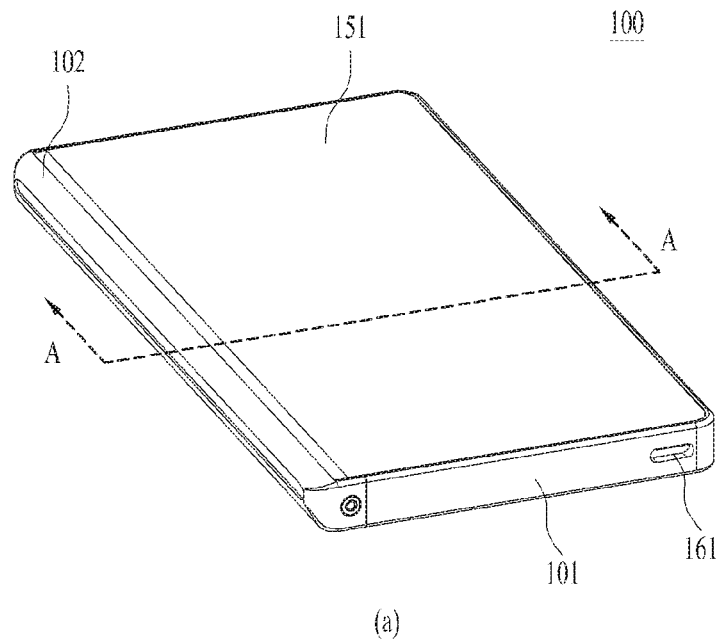
(a)
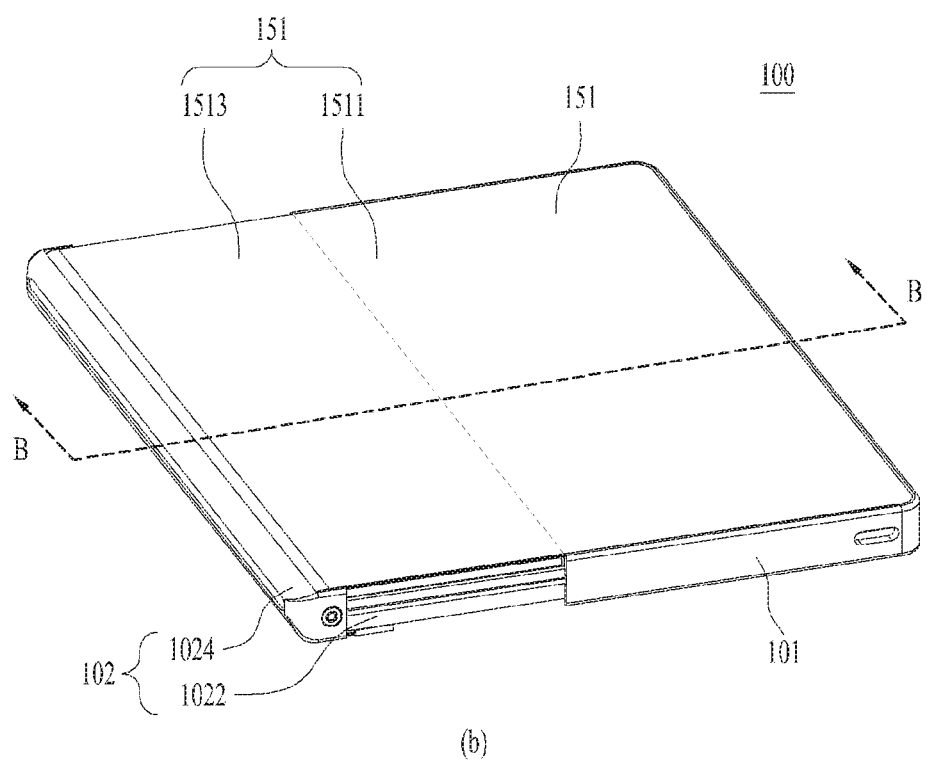
(b)

FIG. 3
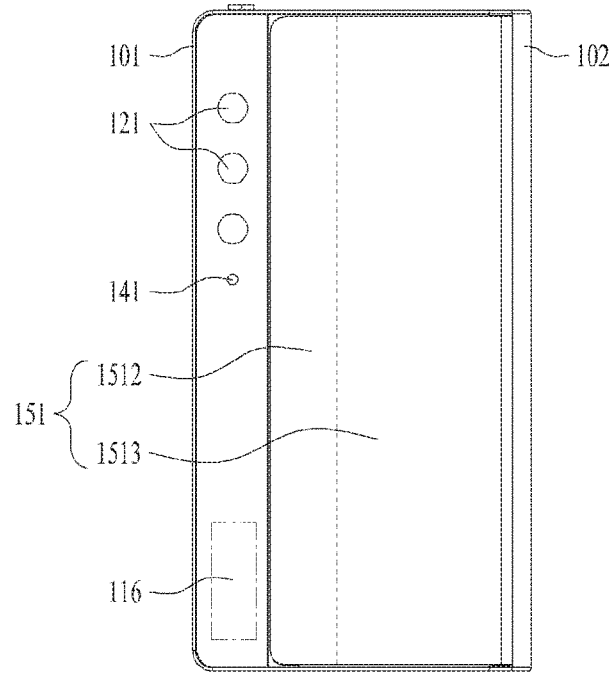
(a)
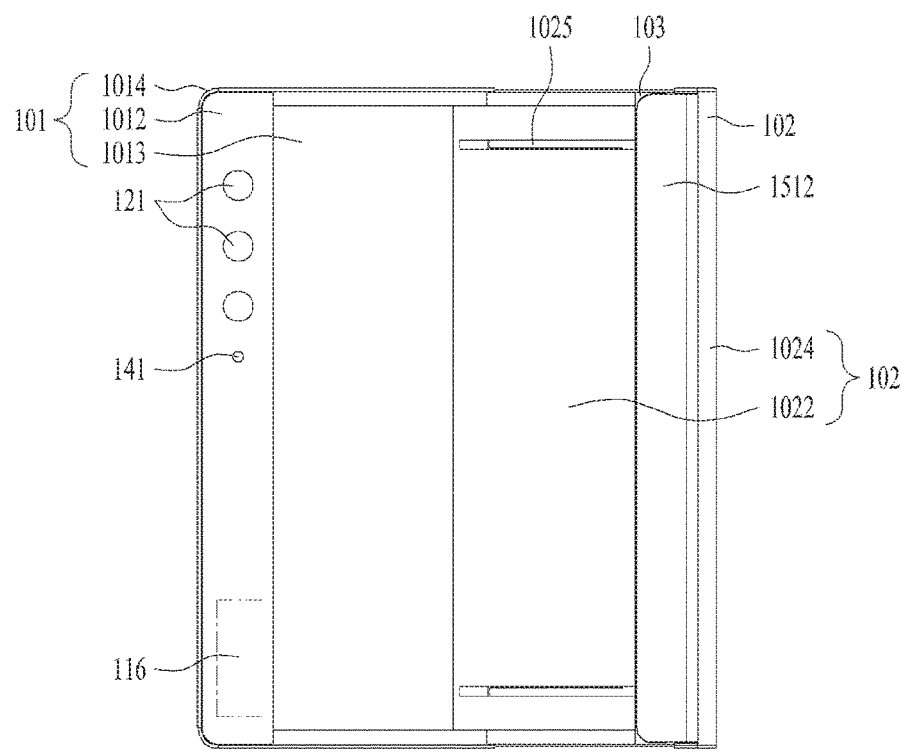
(b)

(a)  (b)

FIG. 6
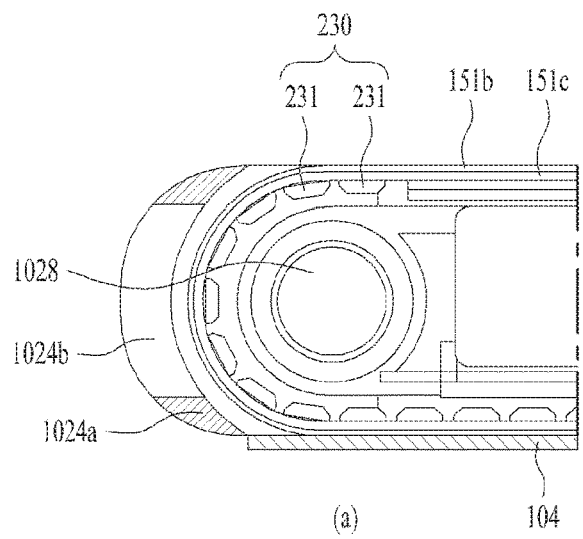
(a)
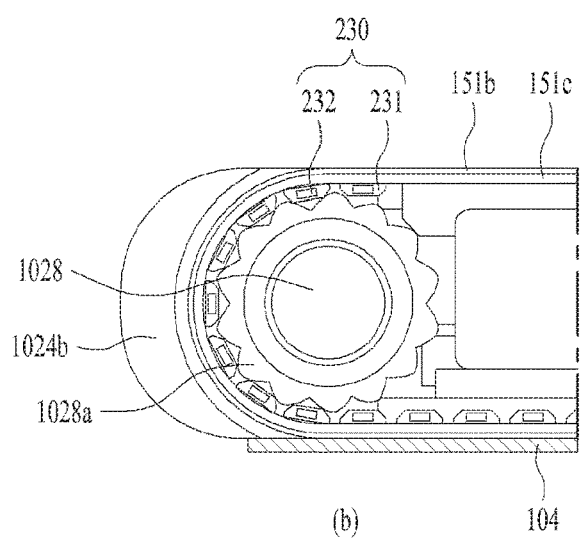
(b)
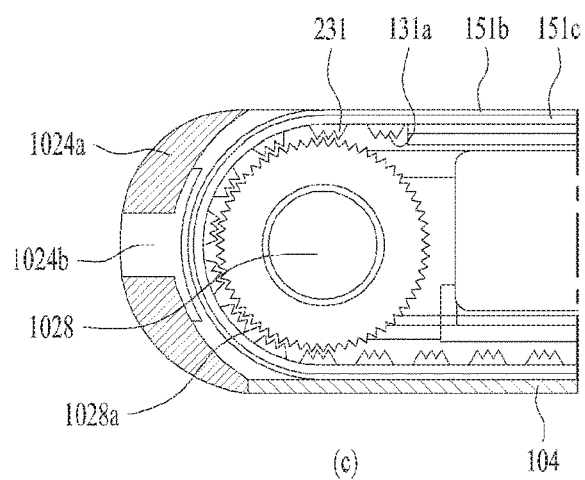
(c)

FIG. 7
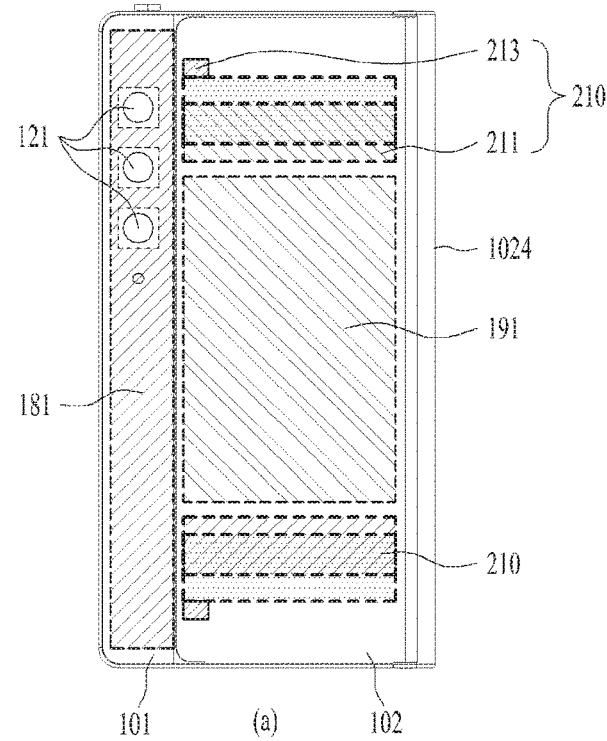
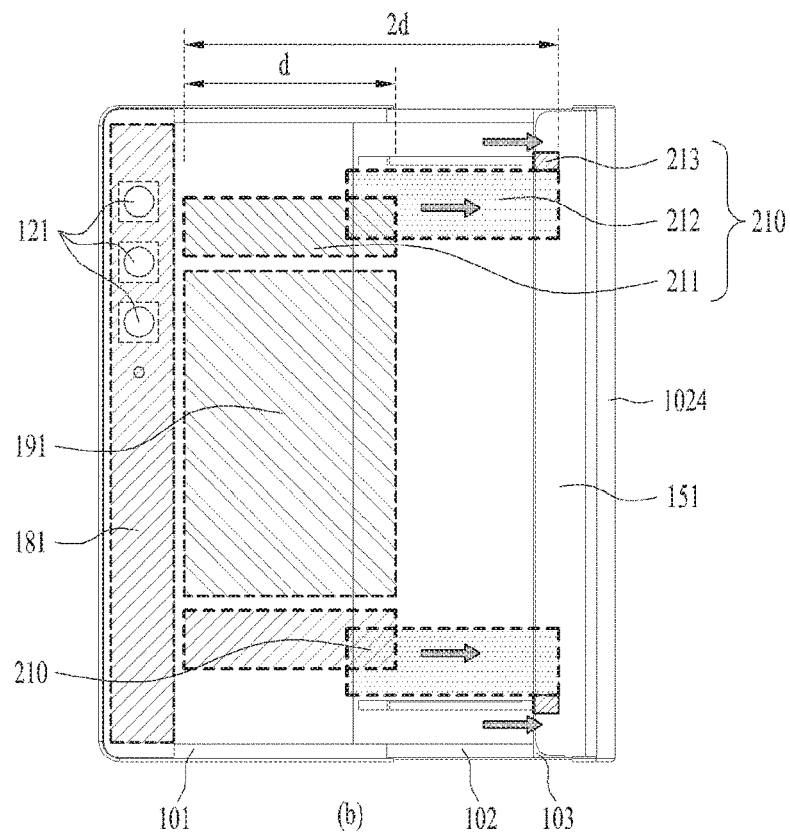

FIG. 8
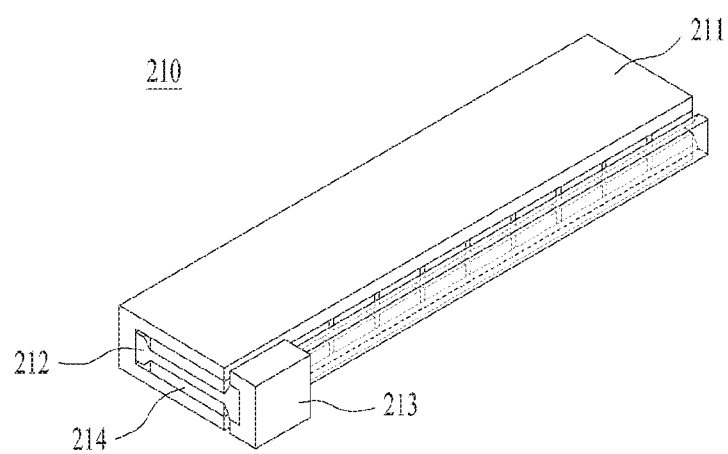
(a)
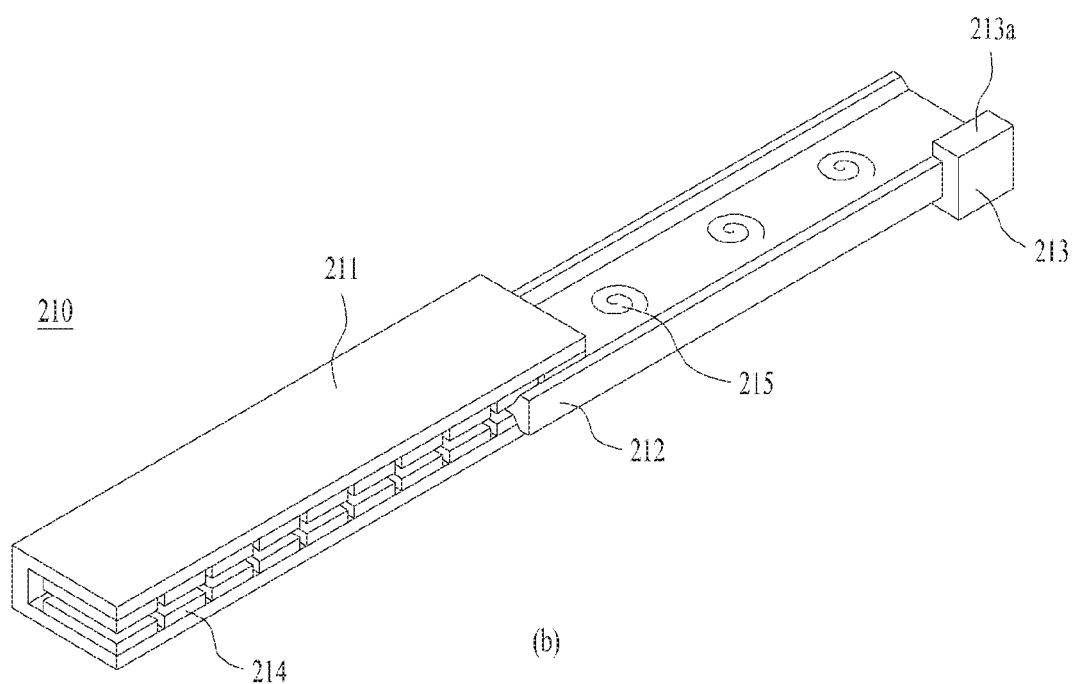
(b)

FIG. 11
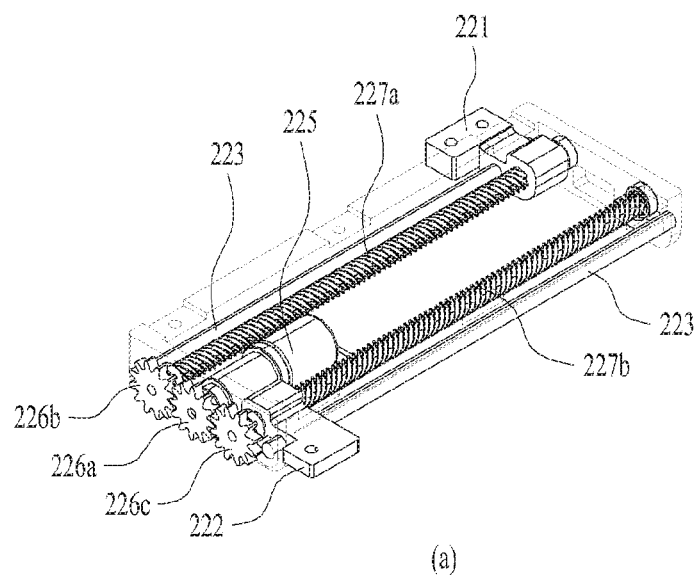
(a)
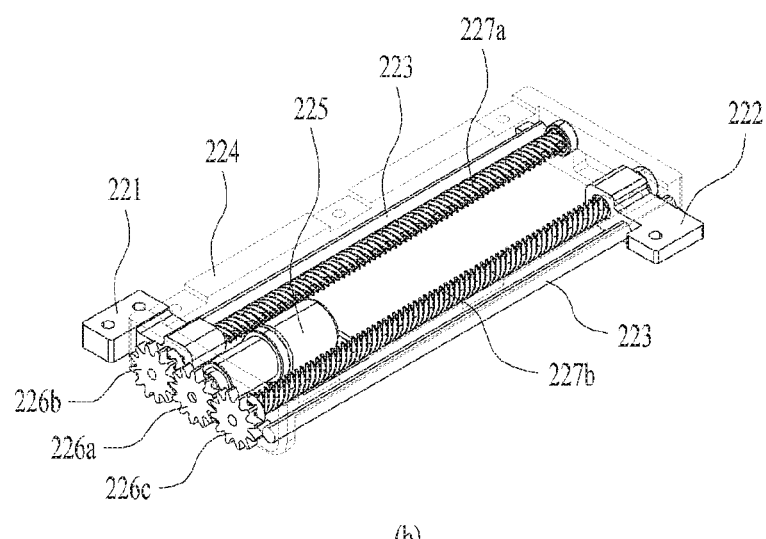
(b)

ROLL-SLIDE MOBILE TERMINAL

Pursuant to 35 U.S.C. § 119, this application claims the benefit of U.S. Provisional Patent Application No. 62/805,920, filed on Feb. 14, 2019, and also claims the benefit of earlier filing date and right of priority to Korean Application No. 10-2019-0040329, filed on Apr. 5, 2019, the contents of which are all hereby incorporated by reference herein in their entirety.

BACKGROUND OF THE DISCLOSURE

Field of the Disclosure

The present invention relates to a mobile terminal, and more particularly, to a roll-slide mobile terminal having a flexible display and capable of extending a size of a screen.

Background of the Disclosure

Terminals may be generally classified as mobile/portable terminals or stationary terminals according to their mobility. Mobile terminals may also be classified as handheld terminals or vehicle mounted terminals according to whether or not a user can directly carry the terminal.

A display device is a device equipped with functions of receiving, processing and displaying user-viewable images. The display device, for example, receives broadcasting selected by a user from broadcast signals broadcasted by a broadcasting station, splits video signals from the received signals, and displays the split video signals on a display.

Recently, owing to the developments of broadcast and network technologies, functions of a display device have been considerably diversified and performance of the device has been improved correspondingly. Namely, the display device has been developed so as to provide a user with various contents as well as simply broadcasted contents. For example, the display device can provide game play, listening to music, Internet shopping, user-customized information and the like using various applications as well as programs received from broadcasting stations. In order to perform such extended functions, the display device is basically connected to other devices or a network using various communication protocols and is able to provide ubiquitous computing environments to a user. Namely, the display device has been evolved into a smart device that enables connectivity to a network and ubiquitous computing.

Recently, a flexible display having sufficient elasticity to enable big deformation has been developed. The flexible display may be deformed to be rolled. A mobile terminal receives the rolled flexible display and may protrude the display to the outside of its body at a desired size. Therefore, the mobile terminal may have a more compact size in accordance with a use of the flexible display. Also, as the mobile terminal comprises such a rollable display, the mobile terminal may be referred to as a rollable mobile terminal.

In order to use the rollable mobile terminal, a user may eject the display from a body of the mobile terminal and at the same time the display may be extended to a size desired by the user. However, the display may be extended to various directions by the user, and relative alignment or arrangement of the display for the user may be varied depending on the extended direction. Therefore, in order to allow the user to view intended contents or screen, the mobile terminal needs to align contents or screen on the display in consideration of the varied display or relative alignment of the user. Moreover, the mobile terminal additionally needs to adjust the aligned contents in consideration of the extended direction and alignment.

SUMMARY OF THE DISCLOSURE

An object of the present invention is to provide a roll-slide mobile terminal capable of improving durability of a flexible display unit as a point where the flexible display unit is folded is limited to a specific position.

Another object of the present invention is to provide a roll-slide mobile terminal comprising a support structure of a flexible display unit, in which the flexible display unit may stably be supported when it is extended.

Other object of the present invention is to provide a roll-slide mobile terminal that prevents a flexible display unit from being damaged by external impact at a side where the flexible display is folded.

A roll-slide mobile terminal comprises a first frame; a second frame sliding in a first direction with respect to the second frame; a third frame arranged on a rear surface of the second frame, moving in the first direction with respect to the second frame; a flexible display unit including a first area coupled to a rear surface of the first frame, a second area coupled to the third frame, and a third area arranged between the first area and the second area; and a driving unit sliding the second frame in the first direction with respect to the first frame and sliding the third frame in the first direction with respect to the second frame, wherein an area of the third area arranged in the first area of the flexible display unit in the first direction is widened and a first state is shifted to a second state when the second frame moves in the first direction with respect to the first frame.

The second frame and the third frame may be movable in a second direction opposite to the first direction, and an area of a front surface of the flexible display unit may be reduced and the second state may be shifted to the first state when the second frame and the third frame move in the second direction.

The first frame may include a first rear portion which is not overlapped with the flexible display unit and a second rear portion overlapped with the flexible display unit in the first state, and the roll-slide mobile terminal may further comprise a camera arranged on the first rear portion of the first frame.

The second frame may include a third rear portion arranged on a rear surface of the second rear portion in the first state, and the third frame may slide on a rear surface of the third rear portion.

The roll-slide mobile terminal may further comprise a support frame coupled to a rear surface of the third area of the flexible display unit.

The first frame may further include a first front portion arranged on a rear surface of the first area of the flexible display unit, the second frame may further include a second front portion arranged on a rear surface of the first front portion in the first state, and the support frame may be arranged between the first front portion and the second front portion in the second state.

The support frame may have a thickness corresponding to that of the first front portion.

The support frame may include a plurality of support bars extended in a third direction vertical to the first direction and arranged in parallel in the first direction.

The support bars may have a trapezoidal or triangular prism shape that includes an inclined surface oblique with respect to a surface adjoining the flexible display unit.

The support bars may include an ejection portion containing plastic resin, and a rigid bar of a metal material buried in the ejection portion.

The flexible display unit may include a display panel to which image is output and a back plate coupled to a rear surface of the display panel, and the support frame may be coupled to a rear surface of the back plate.

The second frame may further include a roller rotatably coupled to an end portion of the first direction, having an outer side in which the third area is rolled.

The roll-slide mobile terminal may further comprise first sawteeth formed on an outer circumference of the roller, and second sawteeth formed on a surface of the support frame and engaged with the first sawteeth.

The support frame may include a plurality of support bars extended in a third direction vertical to the first direction and arranged in parallel in the first direction, and may further include first sawteeth formed on an outer circumference of the roller and inserted between the plurality of support bars.

The second frame may further include a side frame arranged at the end portion of the first direction, covering at least a portion of the third area of the flexible display unit.

At least a portion of the side frame may further include a transparent portion.

The flexible display unit may further include a touch sensor for sensing a touch input, and the side frame may include a conductive material that changes capacitance of the touch sensor in case of a user's touch.

The roll-slide mobile terminal may further comprise a slide slot formed on a rear surface or side of the second frame and extended in the first direction, and a fastener for fastening the driving unit with the third frame may be inserted into the slide slot and move along the slide slot.

The driving unit may include a linear motor including a first bracket coupled to the first frame, a second bracket moving in the first direction with respect to the first bracket, coupled to the second frame, and a third bracket moving in the first direction with respect to the second bracket, coupled to the third frame.

A moving distance of the second frame moving in the first direction with respect to the first frame may be equal to a moving distance of the third frame moving in the first direction with respect to the second frame.

The driving unit may include a housing fixed to the second frame, a motor received in the housing, providing a rotational force, first and second screw conveyers rotated by the rotational force transferred from the motor, a first moving unit fastened to the first frame, moving in the first direction when the first screw conveyer is rotated, and a second moving unit fastened to the third frame, moving in a direction opposite to the moving direction of the first moving unit when the second screw conveyer is rotated.

The driving unit may include a first gear fastened to the motor, and second and third gears rotated to be engaged with the first gear and fastened to the first screw conveyer and the second screw conveyer.

Screw directions of the first screw conveyer and the second screw conveyer may be opposite to each other.

The roll-slide mobile terminal may further comprise a first guide bar arranged in parallel with the first screw conveyer, passing through the first moving unit, and a second guide bar arranged in parallel with the second screw conveyer, passing through the second moving unit.

The roll-slide mobile terminal may further comprise a rear cover having at least a portion which is transparent, and covering a rear surface of the roll-slide mobile terminal in the first state.

Since the roll-slide mobile terminal of the present invention does not limit a point where the flexible display unit is folded to a specific position, durability of the flexible display unit may be improved.

Also, since the flexible display unit may stably be supported when it is extended, it is possible to minimize difficulty in a touch input.

Also, the flexible display unit from may be prevented from being damaged by external impact at a side where the flexible display is folded.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings, which are given by illustration only, and thus are not limitative of the present invention, and wherein:

FIG. 2 is a perspective view illustrating a first state and a second state when a roll-slide mobile terminal according to the present invention is viewed at one side;

FIG. 3 is a rear view illustrating a first state and a second state of a roll-slide mobile terminal according to the present invention;

FIG. 6 is a cross-sectional view taken along line C-C, D-D and E-E of FIG. 5;

FIG. 7 is a view illustrating an operation of a motor according to one embodiment of a roll-slide mobile terminal of the present invention;

FIG. 8 is a view illustrating a linear motor of FIG. 7;

FIG. 11 is a view illustrating a driving unit of FIG. 9.

DETAILED DESCRIPTION OF THE PREFERRED EMBODIMENTS

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Figure 1:
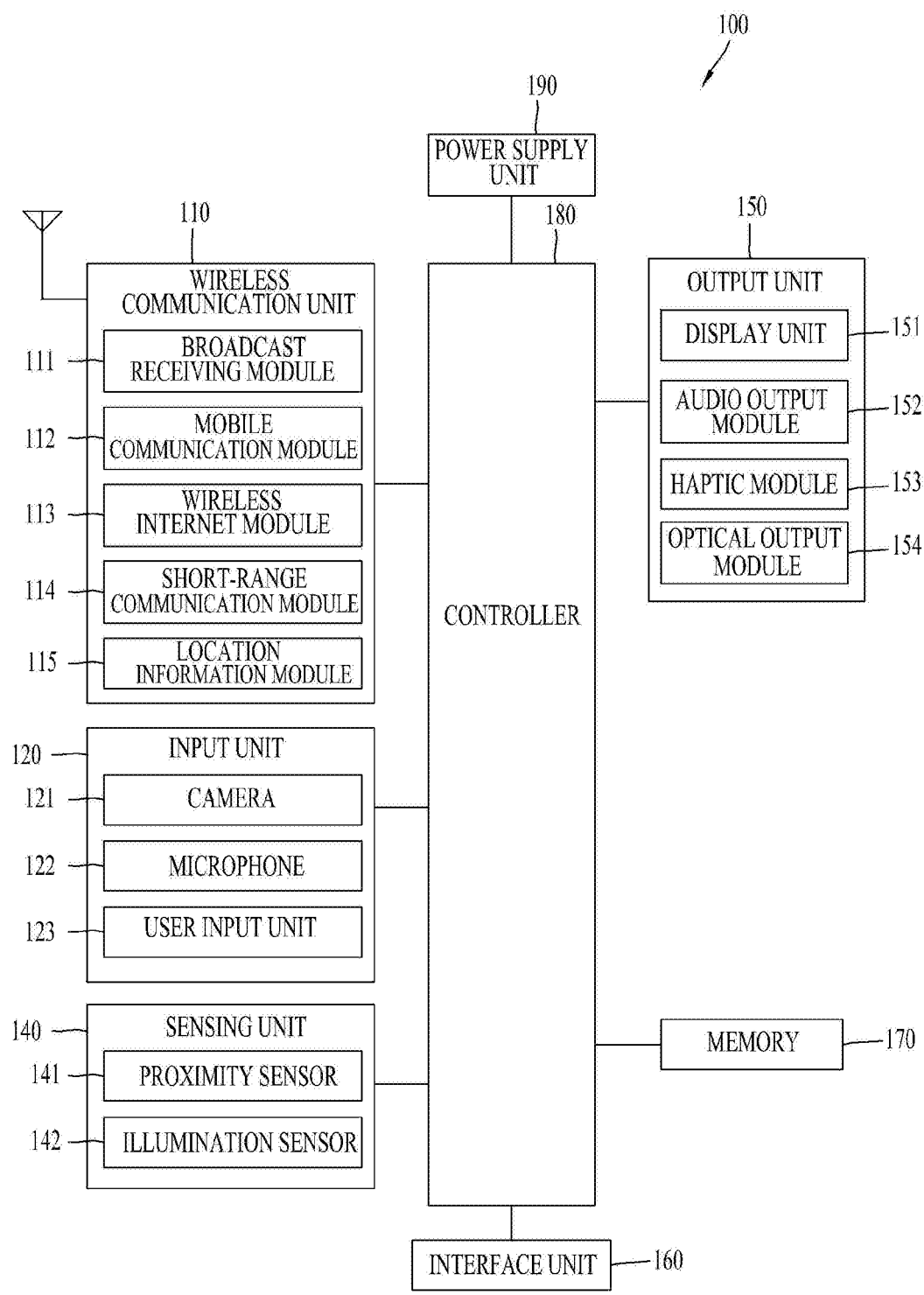
FIG. 1 is a block diagram of a role-slide mobile terminal in accordance with the present disclosure.

FIG. 1 is a block diagram of a mobile terminal in accordance with the present disclosure.

The mobile terminal 100 is shown having components such as a wireless communication unit 110, an input unit 120, a sensing unit 140, an output unit 150, an interface unit 160, a memory 170, a controller 180, and a power supply unit 190. It is understood that implementing all of the illustrated components in The FIG. 1A is not a requirement, and that greater or fewer components may alternatively be implemented.

More specifically, the wireless communication unit 110 typically includes one or more modules which permit communications such as wireless communications between the mobile terminal 100 and a wireless communication system, communications between the mobile terminal 100 and another mobile terminal, communications between the mobile terminal 100 and an external server. Further, the wireless communication unit 110 typically includes one or more modules which connect the mobile terminal 100 to one or more networks.

To facilitate such communications, the wireless communication unit 110 includes one or more of a broadcast receiving module 111, a mobile communication module 112, a wireless Internet module 113, a short-range communication module 114, and a location information module 115.

Regarding the wireless communication unit 110, the broadcast receiving module 111 is typically configured to receive a broadcast signal and/or broadcast associated information from an external broadcast managing entity via a broadcast channel. The broadcast channel may include a satellite channel, a terrestrial channel, or both. In some embodiments, two or more broadcast receiving modules 111 may be utilized to facilitate simultaneously receiving of two or more broadcast channels, or to support switching among broadcast channels.

The mobile communication module 112 can transmit and/or receive wireless signals to and from one or more network entities. Typical examples of a network entity include a base station, an external mobile terminal, a server, and the like. Such network entities form part of a mobile communication network, which is constructed according to technical standards or communication methods for mobile communications (for example, Global System for Mobile Communication (GSM), Code Division Multi Access (CDMA), CDMA2000 (Code Division Multi Access 2000), EV-DO (Enhanced Voice-Data Optimized or Enhanced Voice-Data Only), Wideband CDMA (WCDMA), High Speed Downlink Packet access (HSDPA), HSUPA (High Speed Uplink Packet Access), Long Term Evolution (LTE), LTE-A (Long Term Evolution-Advanced), and the like).

Examples of wireless signals transmitted and/or received via the mobile communication module 112 include audio call signals, video (telephony) call signals, or various formats of data to support communication of text and multimedia messages.

The wireless Internet module 113 is configured to facilitate wireless Internet access. This module may be internally or externally coupled to the mobile terminal 100. The wireless Internet module 113 may transmit and/or receive wireless signals via communication networks according to wireless Internet technologies.

Examples of such wireless Internet access include Wireless LAN (WLAN), Wireless Fidelity (Wi-Fi), Wi-Fi Direct, Digital Living Network Alliance (DLNA), Wireless Broadband (WiBro), Worldwide Interoperability for Microwave Access (WiMAX), High Speed Downlink Packet Access (HSDPA), HSUPA (High Speed Uplink Packet Access), Long Term Evolution (LTE), LTE-A (Long Term Evolution-Advanced), and the like. The wireless Internet module 113 may transmit/receive data according to one or more of such wireless Internet technologies, and other Internet technologies as well.

In some embodiments, when the wireless Internet access is implemented according to, for example, WiBro, HSDPA, HSUPA, GSM, CDMA, WCDMA, LTE, LTE-A and the like, as part of a mobile communication network, the wireless Internet module 113 performs such wireless Internet access. As such, the Internet module 113 may cooperate with, or function as, the mobile communication module 112.

The short-range communication module 114 is configured to facilitate short-range communications. Suitable technologies for implementing such short-range communications include BLUETOOTH™, Radio Frequency IDentification (RFID), Infrared Data Association (IrDA), Ultra-WideBand (UWB), ZigBee, Near Field Communication (NFC), Wireless-Fidelity (Wi-Fi), Wi-Fi Direct, Wireless USB (Wireless Universal Serial Bus), and the like. The short-range communication module 114 in general supports wireless communications between the mobile terminal 100 and a wireless communication system, communications between the mobile terminal 100 and another mobile terminal 100, or communications between the mobile terminal and a network where another mobile terminal 100 (or an external server) is located, via wireless area networks. One example of the wireless area networks is a wireless personal area networks.

The location information module 115 is generally configured to detect, calculate, derive or otherwise identify a position of the mobile terminal. As an example, the location information module 115 includes a Global Position System (GPS) module, a Wi-Fi module, or both. If desired, the location information module 115 may alternatively or additionally function with any of the other modules of the wireless communication unit 110 to obtain data related to the position of the mobile terminal. As one example, when the mobile terminal uses a GPS module, a position of the mobile terminal may be acquired using a signal sent from a GPS satellite. As another example, when the mobile terminal uses the Wi-Fi module, a position of the mobile terminal can be acquired based on information related to a wireless access point (AP) which transmits or receives a wireless signal to or from the Wi-Fi module.

The input unit 120 includes a camera 121 for obtaining images or video, a microphone 122, which is one type of audio input device for inputting an audio signal, and a user input unit 123 (for example, a touch key, a push key, a mechanical key, a soft key, and the like) for allowing a user to input information. Data (for example, audio, video, image, and the like) is obtained by the input unit 120 and may be analyzed and processed by controller 180 according to device parameters, user commands, and combinations thereof.

Cameras 121 may process image frames of still pictures or video obtained by image sensors in a video or image capture mode. The processed image frames can be displayed on the display unit 151 or stored in memory 170. In some cases, the cameras 121 may be arranged in a matrix configuration to permit a plurality of images having various angles or focal points to be input to the mobile terminal 100. As another example, the cameras 121 may be located in a stereoscopic arrangement to acquire left and right images for implementing a stereoscopic image.

The microphone 122 is generally implemented to permit audio input to the mobile terminal 100. The audio input can be processed in various manners according to a function being executed in the mobile terminal 100. If desired, the microphone 122 may include assorted noise removing algorithms to remove unwanted noise generated in the course of receiving the external audio.

The user input unit 123 is a component that permits input by a user. Such user input may enable the controller 180 to control operation of the mobile terminal 100. The user input unit 123 may include one or more of a mechanical input element (for example, a key, a button located on a front and/or rear surface or a side surface of the mobile terminal 100, a dome switch, a jog wheel, a jog switch, and the like), or a touch-sensitive input, among others. As one example, the touch-sensitive input may be a virtual key or a soft key, which is displayed on a touch screen through software processing, or a touch key which is located on the mobile terminal at a location that is other than the touch screen. On the other hand, the virtual key or the visual key may be displayed on the touch screen in various shapes, for example, graphic, text, icon, video, or a combination thereof.

The sensing unit 140 is typically implemented using one or more sensors configured to sense internal information of the mobile terminal, the surrounding environment of the mobile terminal, user information, and the like. For example—the sensing unit 140 may alternatively or additionally include other types of sensors or devices, such as a proximity sensor 141 and an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The mobile terminal 100 may be configured to utilize information obtained from sensing unit 140, and in particular, information obtained from one or more sensors of the sensing unit 140, and combinations thereof.

The output unit 150 is typically configured to output various types of information, such as audio, video, tactile output, and the like. The output unit 150 is shown having a display unit 151, an audio output module 152, a haptic module 153, and an optical output module 154. The display unit 151 may have an inter-layered structure or an integrated structure with a touch sensor in order to facilitate a touch screen. The touch screen may provide an output interface between the mobile terminal 100 and a user, as well as function as the user input unit 123 which provides an input interface between the mobile terminal 100 and the user.

The audio output module 152 is generally configured to output audio data. Such audio data may be obtained from any of a number of different sources, such that the audio data may be received from the wireless communication unit 110 or may have been stored in the memory 170. The audio data may be output during modes such as a signal reception mode, a call mode, a record mode, a voice recognition mode, a broadcast reception mode, and the like. The audio output module 152 can provide audible output related to a particular function (e.g., a call signal reception sound, a message reception sound, etc.) performed by the mobile terminal 100. The audio output module 152 may also be implemented as a receiver, a speaker, a buzzer, or the like.

A haptic module 153 can be configured to generate various tactile effects that a user feels, perceive, or otherwise experience. A typical example of a tactile effect generated by the haptic module 153 is vibration. The strength, pattern and the like of the vibration generated by the haptic module 153 can be controlled by user selection or setting by the controller. For example, the haptic module 153 may output different vibrations in a combining manner or a sequential manner.

An optical output module 154 can output a signal for indicating an event generation using light of a light source. Examples of events generated in the mobile terminal 100 may include message reception, call signal reception, a missed call, an alarm, a schedule notice, an email reception, information reception through an application, and the like.

The interface unit 160 serves as an interface with various types of external devices that can be coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). It is common for application programs to be stored in the memory 170, installed in the mobile terminal 100, and executed by the controller 180 to perform an operation (or function) for the mobile terminal 100.

The controller 180 typically functions to control overall operation of the mobile terminal 100, in addition to the operations associated with the application programs. The controller 180 may provide or process information or functions appropriate for a user by processing signals, data, information and the like, which are input or output, or activating application programs stored in the memory 170.

To drive the application programs stored in the memory 170, the controller 180 may be implemented to control a predetermined number of the components mentioned above in reference with FIG. 1A. Moreover, the controller 180 may be implemented to combinedly operate two or more of the components provided in the mobile terminal 100 to drive the application programs.

The power supply unit 190 can be configured to receive external power or provide internal power in order to supply appropriate power required for operating elements and components included in the mobile terminal 100. The power supply unit 190 may include a battery, and the battery may be configured to be embedded in the terminal body, or configured to be detachable from the terminal body.

Some or more of the components may be operated cooperatively to embody an operation, control or a control method of the mobile terminal in accordance with embodiments of the present disclosure. Also, the operation, control or control method of the mobile terminal may be realized on the mobile terminal by driving of one or more application problems stored in the memory 170.

FIG. 2 is a perspective view illustrating a roll-slide mobile terminal 100 according to one embodiment of the present invention, and FIG. 3 is a rear view illustrating a first state and a second state of a roll-slide mobile terminal 100 according to the present invention. FIGS. 2(*a*) and 3(*a*) illustrate a first state of the roll-slide mobile terminal 100 according to one embodiment of the present invention, and FIGS. 2(*b*) and 3(*b*) illustrate a second state of a roll-slide mobile terminal 100 according to one embodiment of the present invention.

The roll-slide mobile terminal 100 of the first state has a size smaller than that of the roll-slide mobile terminal 100 of the second state in a first direction. In the roll-slide mobile terminal 100 of the second state, the size of the first direction is extended and a size of a display unit 151 arranged on a front surface becomes greater than the first state. A direction along which the roll-slide mobile terminal 100 is extended is referred to as a first direction, a direction along which the roll-slide mobile terminal 100 is contracted to be shifted from the second state to the first state is referred to as a second direction, and a direction vertical to the second direction is referred to as a third direction.

The roll-slide mobile terminal 100 of the present invention may be shifted from the first state that the display unit is arranged on the front surface to the second state by extending the screen as shown in FIG. 2(*b*) in the same manner as a bar shaped mobile terminal. In the second state, an area of the display unit 151 arranged on the front surface is enlarged, and an area of the display unit arranged on a rear surface is reduced as shown in FIG. 3(*b*). That is, the display unit arranged on the rear surface in the first state moves toward the front surface in the second state.

In this way, a flexible display unit 151 which is bent may be used as the display unit such that the position of the display unit may be varied. The flexible display means a display, which is manufactured on a thin and flexible substrate capable of being curved, bent, folded, twisted or rolled like a paper, lightweight and robust not to be easily broken while maintaining characteristics of the existing flat panel display.

Also, an electronic paper is based on a display technique to which a feature of a general ink is applied, and is different from the existing flat panel display in that it uses reflective light. The electronic paper may change information by using electrophoresis that uses a twist ball or capsule.

In a state that the flexible display unit 151 is not deformed (for example, the state that the flexible display unit 151 has an infinite curvature radius, hereinafter, referred to as base state), a display area of the flexible display unit 151 becomes a plane. In a state (for example, the state having a finite curvature radius, hereinafter, referred to as a deformation state) deformed by an external force from the base state, the display area may be a curved surface. As shown, information displayed in the deformation state may be visual information output to the curved surface. This visual information is implemented as luminescence of unit sub-pixels arranged in a matrix arrangement is controlled independently. The unit sub-pixel means a minimum unit for implementing one color.

The flexible display unit 151 may be arranged in a bent state (for example, the state bent in a vertical or horizontal direction) not a flat state in the base state. In this case, if an external force is applied to the flexible display unit 151, the flexible display unit 151 may be deformed in a flat state (or less bent state) or a more bent state.

Meanwhile, the flexible display unit 151 may implement a flexible touch screen in combination with a touch sensor. If a touch is performed for a flexible touch screen, the controller 180 (see FIG. 1) may perform a control corresponding to such a touch input. The flexible touch screen may be configured to sense a touch input even in the deformation state as well as the base state.

The touch sensor senses a touch (or touch input) applied to the touch screen by using at least one of various touch modes such as a resistive film mode, a capacitance mode, an infrared mode, an ultrasonic mode, and a magnetic field mode.

As an example, the touch sensor may be configured to convert a change of a pressure applied to a specific portion of the touch screen or a change of capacitance occurring in the specific portion to an electric input signal. The touch sensor may be configured to allow a touch target, which performs a touch on the touch screen, to detect a touch position, a touch area, a touch pressure and touch capacitance on the touch sensor.

The roll-slide mobile terminal 100 according to this modified embodiment may include a deformation sensing means capable of sensing deformation of the flexible display unit 151. The deformation sensing means may be included in the sensing unit 140 (see FIG. 1).

The deformation sensing means may be provided in the flexible display unit 151 or a case 201 to sense information related to deformation of the flexible display unit 151. In this case, the information related to deformation may include a direction of the flexible display unit 151 which is modified, a modified level, a modified position, a modified time and restored acceleration of the deformed flexible display unit 151. In addition, the information related to deformation may include various kinds of information to be sensed by bending of the flexible display unit 151.

Also, the controller 180 may modify information displayed on the flexible display unit 151 or generate a control signal for controlling functions of the roll-slide mobile terminal 100, on the basis of the information related to deformation of the flexible display unit 151 sensed by the deformation sensing means.

State deformation of the flexible display unit 151 is not limited to deformation caused by an external force. For example, when the flexible display unit 151 has the first state, the first state may be modified to the second state by a command of a user or an application. In this way, in order that the flexible display unit 151 is modified without external force, the flexible display unit 151 may include a driving unit 210.

The flexible display unit 151 of the present invention may be folded at 180° such that a portion of the flexible display unit 151 may be arranged on the front surface of the roll-slide mobile terminal 100 and another portion of the flexible display unit 151 may be arranged on the rear surface of the roll-slide mobile terminal 100. Since the area of the flexible display unit 151 is determined, if an area of the flexible display unit 151 arranged on the front surface is increased, an area of the flexible display unit 151 arranged on the rear surface is reduced.

As the rear surface including the front surface is covered by the flexible display unit 151, a space in which an antenna conventionally implemented in a rear case can be packaged is restricted. Instead, the antenna may be implemented on the flexible display unit 151. An antenna on display (AOD) is an antenna in which a patterned electrode layer and a patterned dielectric layer configure a transparent film in layers. Since the antenna on display may be implemented more thinly than a laser direct structuring (LDS) technique implemented by the existing copper-nickel plating, it is advantageous in that the antenna is not exposed to the outside without little affecting its thickness. Also, a signal may be transmitted and received even in a direction where the display unit is arranged, and the mobile terminal on which a display unit is arranged at both sides like the present invention may use the antenna on display.

Figure 4:
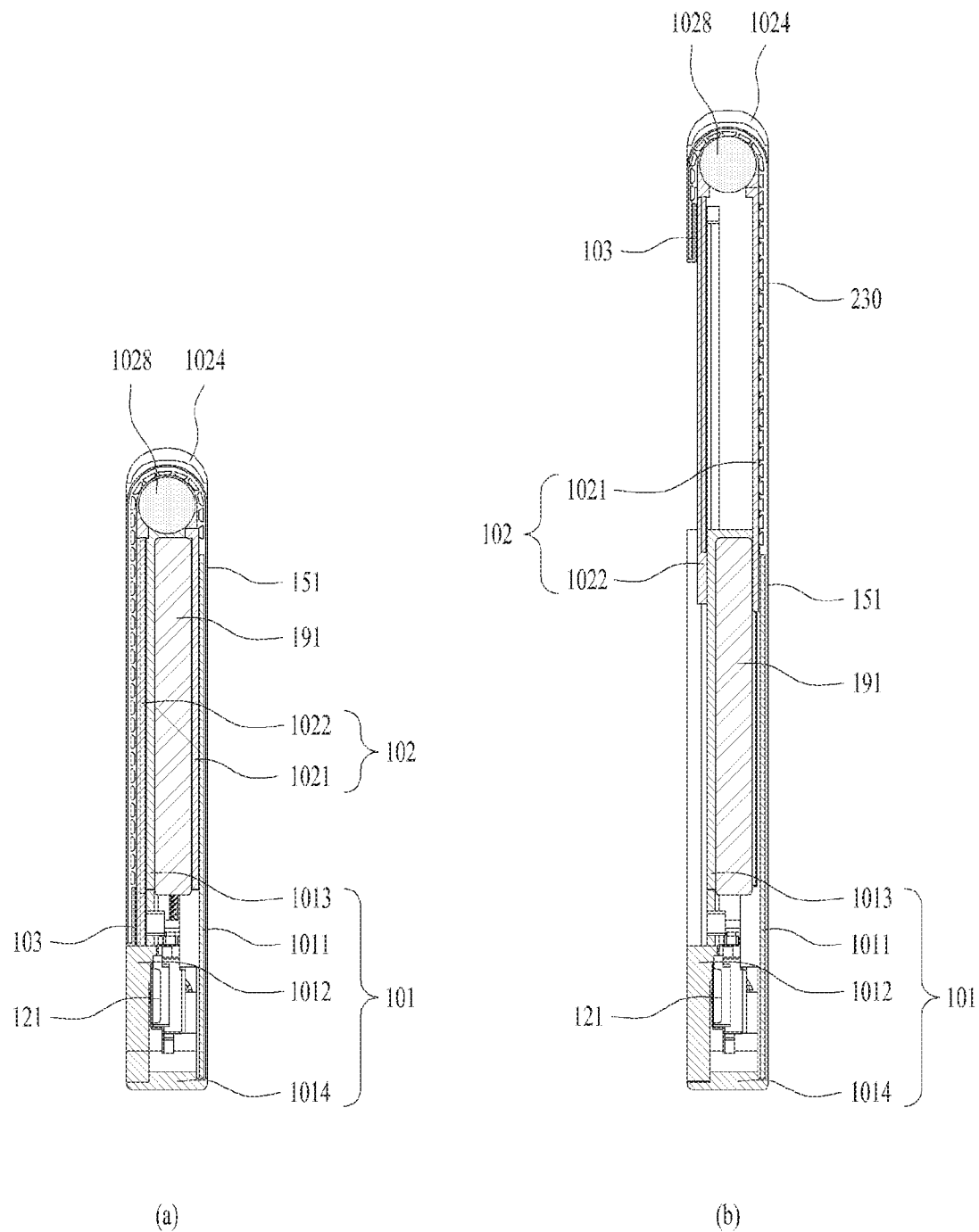
FIG. 4 is a cross-sectional view taken along line A-A and B-B of FIG. 2.

FIG. 4 is a cross-sectional view taken along line A-A and B-B of FIG. 2. The roll-slide mobile terminal 100 of the present invention includes a first frame 101, a second frame 102 sliding in a first direction with respect to the first frame 101, and a third frame 103 sliding in the first direction with respect to the second frame 102. FIG. 4*a* shows the mobile terminal in a fully closed position. In the fully closed position, the second frame may be in a first position with respect to the first frame, and the third frame may be in a third position with respect to the second frame. However, when the mobile terminal is in a fully open position, as shown in FIG. 4*b*, the second frame may be in a second position with respect to the first frame, and the third frame may be in a fourth position with respect to the second frame. The second frame and third frame may be slidable in response to a manual force provided by a user for example, or a motor may be included to provide force.

As will be discussed further, in a particular embodiment, it may be the case that a motor is provided at the second frame which moves the first frame and the third frame in opposite directions from each other with respect to the second frame to move the mobile terminal from the fully closed position to the fully open position. Accordingly in the particular embodiment, the motor may move the first frame and the third frame toward each other with respect to the second frame to move the mobile terminal from the fully open position to the fully closed position. In this particular embodiment, while it may be the case that the motor is moving the first and third frames with respect to the second frame, it will be understood that this produces the result of the second frame moving with respect to the first frame and the third frame moving with respect to the second frame should the user hold the first frame stationary—or should the first frame be otherwise rendered stationary by other means—during the motor operation. For the purposes of brevity, where not specifically defined, the movement of the frames will be discussed in relative terms with respect to other frames, however it will be understood that the discussion of the relative frame movements considers various other configurations and positions of the frames and/or motor(s), where one of the first, second, or third frame is considered as stationary, and the remaining two frames are moved or slidable with respect to the stationary frame.

It will also be understood that movement of the frames between positions with respect to other frames as discussed is not exclusive of positions between the identified positions, and one of ordinary skill in the art will understand that the disclosure includes configurations in which the display unit may be secured, locked, viewed, or otherwise used by a user when one or more of the frames are at positions in between the specifically identified relative sliding or moving positions. Additionally, discussion of a movement between a particular starting position to a particular ending position will include movement past or through all of the positions in between the starting position and the ending position.

The first frame 101 and the second frame 102 include a front portion, a rear portion, and a side portion, and may configure external appearance of a hexahedron of the roll-slide mobile terminal 100. A first area 1511 arranged at one side of the flexible display unit 151 is fixed to the front surface of the first frame 101. A third area 1512 adjacent to the first area 1511 in the first direction partially covers the front surface of the second frame 101 and partially covers the rear surface of the second frame 102.

A second area arranged at the other side of the flexible display unit 151 is arranged on the rear surface of the mobile terminal and coupled to the third frame 103 without directly being coupled to the second frame 102. The third frame 103 is a plate shaped member slidably coupled to the rear surface of the second frame 102 in the first direction. As shown in FIG. 3(*b*), a slide slot 1025 extended in the first direction is formed in the second frame 102, and the third frame 103 may move along the slide slot 1025. Although the slide slot 1025 is formed on the rear surface of the second frame 102 in FIG. 3(*b*), the slide slot 1025 may be formed at a side of the second frame 102.

In short, the flexible display unit 151 includes a first area 1511 fixed to the first frame 101, a second area 1512 fixed to the third frame 103, and a third area 1513 located between the first area 1511 and the second area 1512 and arranged on the front surface or the rear surface in accordance with the state of the roll-slide mobile terminal 100.

The first area 1511 and the second area 1512 maintain a flat base state without any change of their curvatures but the third area 1513 is folded at the other side of the second frame 102 and then bent toward the rear surface. The area of the third area 1513 located in the first direction of the first area 1511 is increased when the first state is shifted to the second state. The folded position in the third area 1513 may be varied depending on the sliding position of the second frame 102. In other words, the amount of the third area 1513 which is visible from a front of the display device increases as the first state is shifted to the second state, which in some embodiments includes when the second frame is moved from the first position to the second position with respect to the first frame and when the third frame is moved from the third position to the fourth position with respect to the second frame. The amount of the third area 1513 which is coplanar with the first area 1511 may increase as the first state is shifted to the second state, which in some embodiments includes when the second frame is moved from the first position to the second position with respect to the first frame and when the third frame is moved from the third position to the fourth position with respect to the second frame.

Since the foldable mobile terminal 100 unfolded like a book is repeatedly folded at only a specific position, a force is repeatedly applied to one portion, whereby the foldable mobile terminal 100 is likely to be damaged. On the other hand, since the folded portion of the flexible display unit 151 of the present invention is varied depending on the state of the roll-slide mobile terminal 100, fatigue due to deformation concentrated on one portion may be reduced, whereby the flexible display unit 151 may be prevented from being damaged.

The first frame 101 may include a first front portion 1011 to which the first area 1511 of the flexible display unit 151 is coupled, a first rear portion 1012 exposed to the outside even in the first state as shown in FIG. 3(a), and a second rear portion 1013 covered by the second area and the third area of the flexible display unit in the first state and exposed only in the second state as shown in FIG. 3(b).

Since the first rear portion 1012 is always exposed to the outside, a camera 121 or flash, a proximity sensor 141 and the like may be arranged on the first rear portion 1012. Since a conventional bar shaped terminal includes a display unit at only one side, To take both the user and an object boated at an opposite side of the user, the conventional bar shaped terminal needs a camera at both of the rear surface and the front surface.

However, since the flexible display unit 151 is located even on the rear surface of the roll-slide mobile terminal 100 of the present invention, the roll slide mobile terminal 100 of the present invention may take an object located at an opposite side of the user and take the user by using one camera. The camera may include a plurality of cameras having different viewing angles such as wide angle, super-wide angle, and telescopic angle. In addition to the camera, a proximity sensor, a sound output unit, and the like may be located, and the antenna 116 may be implemented on the first rear portion 1012.

The first frame 101 may include a side portion 1014 surrounding its periphery. The side portion 1014 covers both sides of a third direction and one side of the first direction except an end portion of the first direction, through which the second frame 102 is inserted or ejected, and forms an external appearance of the roll-slide mobile terminal 100. An interface unit for connecting a power port or an ear jack or a user input unit such as a volume button may be arranged at the side portion 1014. If the side portion 1014 includes a metal material, the side portion 1014 may serve as an antenna.

The second frame 102 may include a second front portion 1021 arranged on the rear surface of the first front portion 1011 and a third rear portion 1022 covering the rear surface of the second rear portion 1013. The second front portion 1021 supports the rear surface of the extended flexible display unit 151 at the front portion when the state is shifted to the second state. That is, the second front portion 1021 supports the third area 1513 of the flexible display unit 151 in the second state.

The third area 1513 of the flexible display unit 151 is rolled in an end portion of the first direction of the second frame 102, and a cylindrical roller 1028 may be provided such that a rolling portion where the third area is rolled may slowly be bent with a predetermined curvature.

The roller 1028 may be arranged at the end portion of the first direction in the second frame 102, may adjoin an inner side of the flexible display unit 151 and may be rotated together with the flexible display unit 151 such that the second frame 102 may naturally slide when the flexible display unit 151 moves from the rear surface to the front surface or vice versa.

Since the flexible display unit 151 rolled in the roller 1028 is located at the end portion of the first direction of the roll-slide mobile terminal 100, if impact is applied to the roll-slide mobile terminal 100, for example, if the user drops the roll-slid mobile terminal 100, the roll-slide mobile terminal 100 is likely to be damaged. To avoid such a damage, as shown in FIG. 2, the second frame 102 may further include a side frame 1024 for protecting the flexible display unit 151 rolled in the roller 1028.

Figure 5:
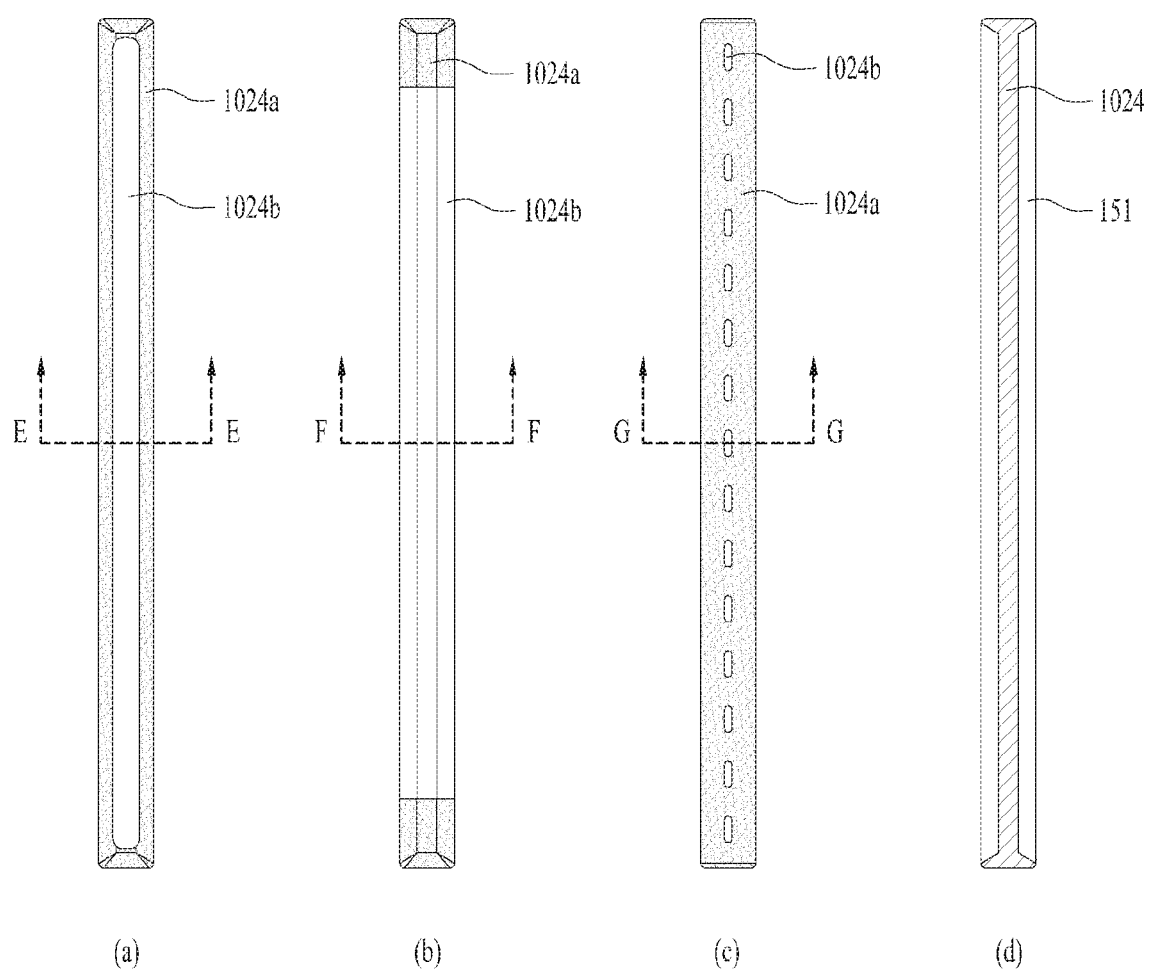
FIG. 5 is a view illustrating various embodiments of a side frame of a roll-slide mobile terminal according to the present invention.

FIG. 5 is a view illustrating various embodiments of a side frame 1024 of a roll-slide mobile terminal 100 according to the present invention, and FIG. 6 is a cross-sectional view taken along line C-C, D-D and E-E of FIG. 5. The side frame 1024 may include an opaque material or a transparent material, or may be configured by mixing an opaque material with a transparent material. A transparent portion 1024b may be formed at the center of the opaque portion 1024a in the form of a window as shown in FIG. 5(a), or the transparent portion 1024b may be formed with a wide area as shown in FIG. 5(b). A user may view image or text output from the flexible display unit 151 through the transparent portion 1024b.

A user input may be performed at a side by using the touch sensor of the flexible display unit 151. For a touch input, a side case may partially include a conductive material. A protrusion may be formed in a portion in which the conductive material is included, whereby the user may input a user command by touching the protrusion portion.

The side frame 1024 may make sure of rigidity while having a natural curved surface by more thickly forming a center portion of an inner side corresponding to the curvature of the flexible display unit 151 rolled in the roller 1028 as shown in FIG. 6.

Also, as shown in FIG. 5(c), the transparent portion 1024b of a predetermined pattern may be configured to drive the flexible display unit 151 and provide a user with notification. For example, if an incoming call occurs, the flexible display unit 151 may be driven to sequentially emit light.

Alternatively, if there is a message or a notification push of an application, alarm of the message and the notification may be provided in a way of emitting light of a specific color from a portion of the flexible display unit 151 rolled in the roller 1028 without a separate light output unit 154. At this time, the transparent portion 1024b may be made of an opaque material not a total-transparent material to obtain an effect in which light is delicately spread.

The flexible display 151 comprises an edge area extended to a partial area in a lateral directionby forming an area of the side frame 1024 to have a thin width in a thickness direction as shown in FIG. 5(d).

Since the side frame 1024 may prevent a problem that the flexible display unit 151 is damaged if its folding side in an out-folding manner is exposed to the outside, durability of the roll-slide mobile terminal 100 may be improved.

FIG. 6 illustrates a configuration of the roller 1028 and the flexible display unit 151 as well as the side frame 1024. The flexible display unit 151 of the present invention may include a display panel 151b for outputting an image, and a back plate 151c for supporting a rear surface of the display panel 151b.

The display panel 151b may include, for example, an organic light emitting diode (OLED) as a flexible image display device. The back plate 151c may be provided on the rear surface of the display panel 151b, and a metal plate which may be bent together with the display panel 151b if the display panel 151b is bent while having rigidity to support the display panel 151b may be used as the back plate 151c.

The back plate 151c and the display panel 151b may be attached to each other using a junction member. A double-sided tape such as OCA, which can be stretched within a predetermined range like a foam material, may be used as the junction member. Therefore, the junction member may counterbalance a slip phenomenon caused by a curvature radius difference between the back plate 151c and the display panel 151b.

An area of the back plate 151c, which corresponds to the third area, may form a groove formed on a surface and extended in a third direction such that folding may naturally be formed during bending deformation of the third area.

Although the back plate 151c has rigidity, the other areas of the back plate 151c other than the end portion which is supported may be sagged. To support the other areas, the back plate 151c may further include a support frame 230 arranged at the area corresponding to the third area 1513.

The support frame 230 may include a plurality of bar shaped support bars 231 extended in the third direction and continuously arranged in the first direction. Since the support frame has a width of the first direction, which is not wide, the support frame may be formed at a thickness having predetermined rigidity while minimizing an influence affecting bending deformation of the flexible display unit 151, whereby the support frame may support the rear surface of the flexible display unit 151. Particularly, the support frame may have a trapezoidal or triangular section such that an area of a portion adhered to the back plate 151c is smaller than an opposite area to avoid interference between the support bars 231 if the support frame is folded.

The support bars 231 may be formed by plastic ejection, and may reinforce rigidity of the support frame 230 by inserting rigid bars 232 of a metal material into the support bars 231 as shown in FIG. 6(b) if necessary.

The support frame 230 may be formed at a thickness corresponding to that of the first front portion 1011 of the first frame 101. When the first state is shifted to the second state as shown in FIG. 4, the second front portion 1021 arranged at an inner side of the first front portion 1011 is arranged on the rear surface of the second area 1512 of the flexible display unit 151. A space equivalent to the thickness of the first front portion 1011 may be generated between the second front portion 1021 and the back plate 151c, whereby a problem occurs in that the third area 1513 of the flexible display unit 151 is sagged.

The support frame 230 supports the third area 1513 of the flexible display unit 151 while filling the space between the second front portion 1021 and the back plate 151c. Preferably, the support frame 230 may have a thickness corresponding to the space between the second front portion 1021 and the back plate 151c, that is, the thickness of the first front portion 1011.

If the support frame 230 has sufficient rigidity, the second front portion 1021 of the second frame 102 may be omitted. In this case, the thickness of the support frame 230 may be configured regardless of the first front portion 1011 of the first frame.

The roller 1028 is in contact with the rear surface of the support frame 230 and may be provided with first sawteeth 1028a formed thereon as shown in FIG. 6(c) such that the flexible display unit 151 may be rolled in the roller 1028 without slip. The support frame 230 may also be provided with second sawteeth 231a formed thereon to be engaged with the first sawteeth 1028a. Alternatively, the roller 1028 may be provided with first sawteeth 1028a of a width corresponding to the interval of the support bars 231 as shown in FIG. 6(b). The roller 1028 may be rotated in a state that the first sawteeth 1028a is inserted between the support bars 231.

Also, the roll-slide mobile terminal 100 may further include a rear cover 104 covering the rear surface of the roll-slide mobile terminal 100 as shown in FIG. 6(a) to (c). At least a portion of the rear cover 104 may be transparent to check an image output from the flexible display unit 151 arranged on the rear surface. A portion covering the first rear portion 1012 may be formed transparently to correspond to at least the camera 121 or flash.

The rear cover 104 may be coupled to the first frame 101 to cover the first rear portion 1012, and may be spaced apart from the second rear portion 1013 as much as the interval corresponding to the thicknesses of the third rear portion 1022 of the second frame 102, the third frame 103, and the flexible display unit 151. The rear cover 104 covers the flexible display unit 151 if the roll-slide mobile terminal 100 corresponds to the first state. THE flexible display unit 151 may move to a front direction and cover the second rear portion 1013 which is exposed, if the roll-slide mobile terminal 100 corresponds to the second state.

The rear cover 104 may be coupled to the second frame 102. In this case, the rear cover 104 may cover the entire rear surface of the roll-slide mobile terminal 100 in the first state but move together with the second frame 102 in the second state to cover the second area 1512 of the flexible display unit 100 coupled to the third frame 103 and the third rear portion 1022 of the second frame 102.

FIG. 7 is a view illustrating an operation of a motor according to one embodiment of a roll-slide mobile terminal 100 of the present invention, and FIG. 8 is a view illustrating a linear motor 210 of FIG. 7.

If a user holds and pulls the second frame 102 to extend the flexible display unit 151, the flexible display unit 151 may be distorted or the first frame 101 or the second frame 102 may be damaged, whereby the first state may be shifted to the second state or vice versa by the driving unit 210.

The driving unit 210 slides the second frame 102 in the first direction relatively with respect to the first frame 101, and at the same time slides the third frame 103 in the first direction relatively with respect to the second frame 102.

Referring to FIG. 7, when the first state is shifted to the second state and the second frame 102 moves as much as a first distance 'd', the flexible display unit 151 moves as much as a second distance '2d' corresponding to twice of the first distance. In order that the end portion of the flexible display unit 151 moves as much as the second distance, the third frame 103 should moves at the same distance as that of the second frame 102.

Therefore, the driving unit 210 may use the linear motor 210 operating in a linear direction to compensate for such deformation. Referring to FIG. 8, the linear motor 210 may include a first bracket 211 fixed to a first body, a second bracket 212 sliding in the first direction with respect to the first bracket 211, and a third bracket 213 sliding in the first direction with respect to the second bracket 212. When the driving unit 210 is contracted, its length cannot be wider than a third directional width of the third frame, whereby the linear motor 210 may be configured to have at least three stages.

The driving unit 210 packaged in the first frame 101 should be fastened with the third frame 103 arranged on the rear surface of the third rear portion 1022 of the second frame 102. Therefore, a fastener 213a for fastening the third bracket 213 with the third frame 103 is arranged to pass through a slide slot 1025 formed in the second frame 102. The fastener 213a moves in the first direction along the slide slot 1025 and moves the third frame, and the third area 1513 of the flexible display unit 151 sequentially moves in a front direction.

Referring to FIG. 8, the linear motor 210 includes a coil 215 arranged in a magnetic field formed by a magnet. If a current flows to the coil 215, a force is generated in the magnetic field in a linear direction, whereby the coil 215 moves. If the first bracket 211 of the linear motor 210 is provided with a magnet 214 and the second bracket 212 is provided with a coil 215, the second bracket 212 may move. The third bracket 213 may also be provided with a coil, whereby multi-stage movement may be performed in such a manner that the third bracket moves in the first direction by means of the magnetic field of the magnet 214 provided in the first bracket 211 and then the second bracket 212 moves.

The second bracket 212 and the third bracket 213 may simultaneously move at the same distance, or the third bracket 213 may slide with respect to the second bracket 212 after the second bracket moves to be arranged at an end portion of the first bracket 211. In addition to the shape shown in FIG. 8, a multi-stage cylindrical linear motor 210 may be used.

Although only one driving unit 210 may be provided, a pair of driving units 210 may be provided at both sides of the third direction as shown in FIG. 7 such that state change of the roll-slide mobile terminal 100 may stably be made. Parts such as a battery may be arranged between the pair of driving units 210, and a substrate may be arranged on a position corresponding to the first rear portion 1012 as shown in FIG. 7 such that a camera arranged on the first rear portion 1012 may be packaged in the substrate and connected with the flexible display unit 151.

Figure 9:
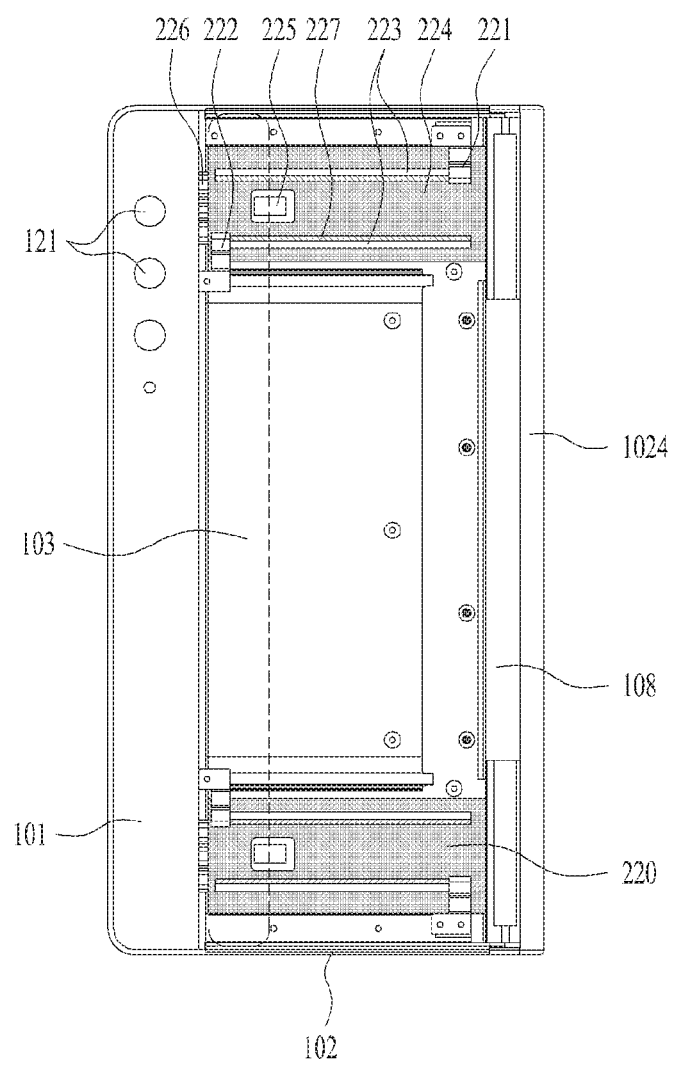
FIGS. 9 and 10 are views illustrating an operation of a driving unit according to one embodiment of a roll-slide mobile terminal of the present invention.
Figure 10:
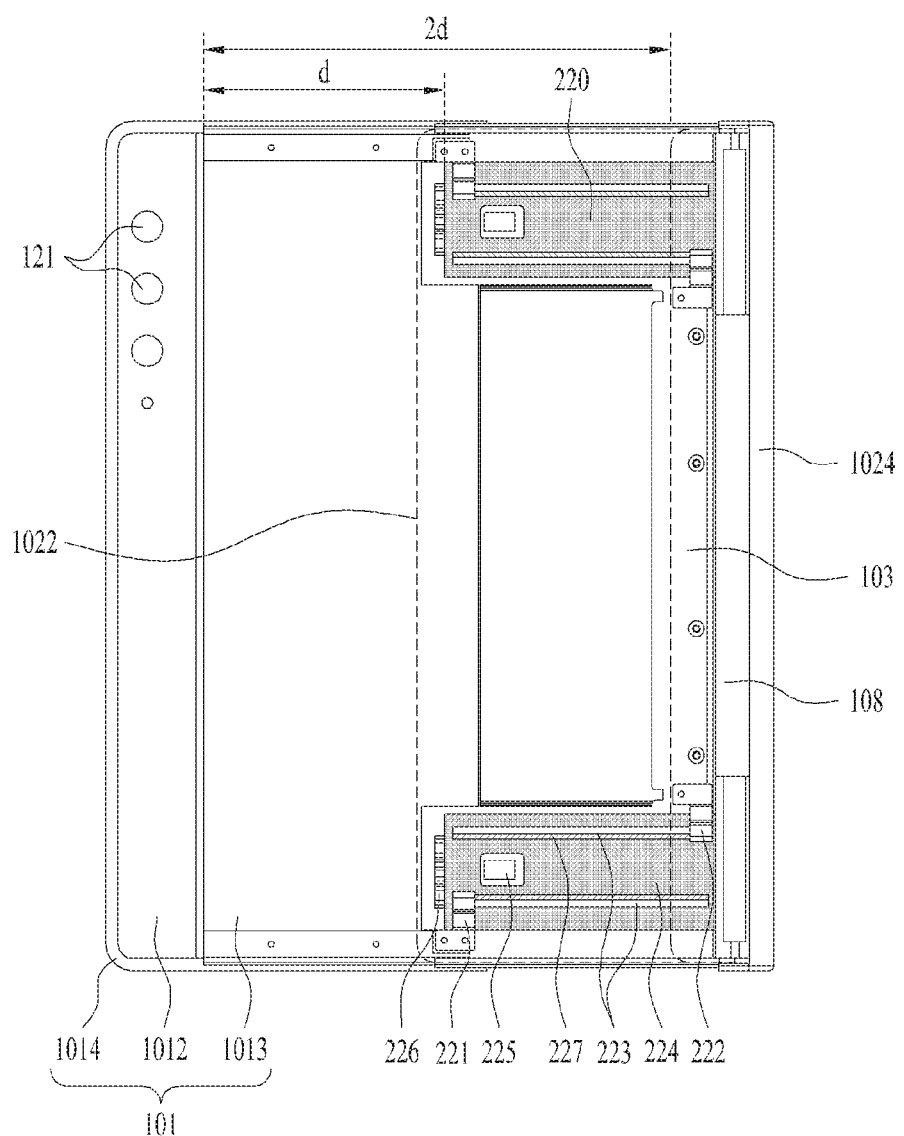

FIGS. 9 and 10 are views illustrating an operation of a driving unit 220 according to one embodiment of a roll-slide mobile terminal 100 of the present invention, and FIG. 11 is a view illustrating a driving unit 220 of FIG. 9.

As the driving unit 220 of this embodiment, a motor 225 having a rotational force and a screw conveyer 227 rotated by a force transferred from the motor 225 may be used. The screw conveyer 227 is a screw shaped bar formed on an outer circumference as shown in FIG. 11, and may include moving units 221 and 222 moving along a screw of the screw conveyer. The moving units 221 and 222 move in a length direction of the screw conveyer 227 if the screw conveyer 227 is rotated, and may shift the rotational force of the motor 225 to a linear movement. The driving unit 220 may further include a guide bar 223 extended in parallel with the screw conveyer 227 to prevent the moving units 221 and 222 from being rotated together with the screw conveyer 227 without performing the linear movement. The moving units 221 and 222 include a hole into which the guide bar 223 is inserted, together with a hole provided with a screw into which the screw conveyer 227 is inserted, and the guide bar 223 serves to assist the moving units 221 and 222 to perform the linear movement without rotation.

The motor 225 and the screw conveyer 227 are packaged in a housing 224, and a gear may be used to transfer the rotational force of the motor 225 to the screw conveyer 227. The gear may include a first gear 226a fastened with the motor 22, and second and third gears 226b and 226c fastened with screw conveyers 227a and 227b and rotated to be engaged with the first gear 226a.

As described above, since the third frame 103 should move as much as the second distance '2d' while the second frame 102 is moving as much as the first distance 'd', the third frame 103 move as much as the first distance 'd' with respect to the second frame 102 while the second frame 102 is moving as much as the first distance 'd' with respect to the first frame 101, whereby the third frame 103 may move as much as a total of second distance '2d'. The driving unit 220 of the present invention may move the third frame 102 as much as the second distance '2d' by using a pair of the screw conveyers 227a and 227b.

As shown in FIG. 11(a), the moving units 221 and 222 are respectively inserted into the screw conveyers 227, wherein elements at a left side on the drawing are referred to as the first screw conveyer 227a and the first moving unit 221, and elements at a right side on the drawing are referred to as the second screw conveyer 227b and the second moving unit 222. The pair of screw conveyers 227a and 227b to which the rotational force of the motor 225 is transferred may move the moving units 221 and 222 in directions opposite to each other. If the motor 225 is rotated, the first screw conveyer 227a is rotated and the first moving unit 221 moves to the left side on the drawing, and if the second screw conveyer 227b is rotated, the second moving unit 222 moves to the right side on the drawing, whereby the second moving unit 222 may become a state shown in FIG. 11(b).

A housing of the driving unit 220 of FIG. 11 is coupled to the second frame 102 as shown in FIGS. 10 and 11. The first moving unit 221 is coupled to the first frame 101, and the second moving unit 222 is coupled to the third frame 103. As shown in FIG. 10, if the motor 225 is rotated, the first moving unit 221 moves the first frame 101 to one side of the first direction with respect to the second frame 102 along the first conveyer. At the same time, the second moving unit 222 moves the third frame 103 to the other side of the first direction with respect to the second frame 102 along the second conveyer.

As a result, the third frame 103 may move as much as the second distance '2d' while the second frame 102 is moving as much as the first distance 'd', whereby the third frame 103 may move the third area 1513 of the flexible display unit 151 to a front direction. when a pair of driving units 220 are installed in the mobile terminal, the first moving unit 221 and the second moving unit 22 may be arranged symmetrically.

As described above, since the roll-slide mobile terminal of the present invention does not limit a point where the flexible display unit 151 is folded to a specific position, durability of the flexible display unit 151 may be improved.

Also, since the flexible display unit 151 may stably be supported when it is extended, it is possible to minimize difficulty in a touch input.

Also, the flexible display unit 151 may be prevented from being damaged by external impact at the side where the flexible display unit 151 is folded.

It will be apparent to those skilled in the art that the present specification can be embodied in other specific forms without departing from the spirit and essential characteristics of the specification. Thus, the above embodiments are to be considered in all respects as illustrative and not restrictive. The scope of the specification should be determined by reasonable interpretation of the appended claims and all change which comes within the equivalent scope of the specification are included in the scope of the specification.

What is claimed is:

1. A mobile terminal comprising:
a first frame;
a second frame configured to be slidable with respect to the first frame between a first position and a second position;
a third frame configured to be slidable at a rear side of the second frame between a third position and a fourth position as the second frame slides between the first position and the second position, wherein the third frame is positioned at the rear side of the second frame in the third and fourth positions;
a sliding unit configured to allow the second frame to slide between the first position and the second position with respect to the first frame and the third frame to slide between the third position and the fourth position with respect to the second frame; and
a flexible display unit comprising:
a first area coupled to a front side of the first frame and facing a front of the mobile terminal;
a second area coupled to the third frame and facing a rear of the mobile terminal; and
a third area between the first area and the second area and continuous with the first area and the second area,
wherein a front portion of the third area facing the front of the mobile terminal increases as the second frame slides from the first position to the second position and the third frame slides from the third position to the fourth position,
wherein a rear portion of the third area facing the rear of the mobile terminal decreases as the front portion of the third area increases, and
wherein a curved portion of the third area is positioned between the front portion and the rear portion.

2. The mobile terminal of claim 1, wherein the front portion of the third area is coplanar with the first area.

3. The mobile terminal of claim 1, wherein:
the second frame moves in a first direction with respect to the first frame when sliding from the first position to the second position; and
the third frame moves in the first direction with respect to the second frame when sliding from the third position to the fourth position.

4. The mobile terminal of claim 1, wherein:
the mobile terminal is in a fully closed state when the second frame is in the first position and the third frame is in the third position; and
the mobile terminal is in a fully open state when the second frame is in the second position and the third frame is in the fourth position.

5. The mobile terminal of claim 4, wherein when the mobile terminal is in the fully closed position, no portion of the third area is coplanar with the first area.

6. The mobile terminal of claim 4, wherein:
the first frame comprises a first rear portion and a second rear portion;
the second rear portion is covered by the flexible display unit when the mobile terminal is in the fully closed position; and
the first rear portion comprises a camera and remains exposed when the mobile terminal is in the fully closed position.

7. The mobile terminal of claim 1, further comprising a roller disposed at a first lateral side of the mobile terminal, wherein the third area of the flexible display unit is configured to be curved around the roller.

8. The mobile terminal of claim 7, further comprising a plurality of supporting members aligned parallel to the first lateral side and configured to support the flexible display unit while allowing the third area of the flexible display unit to be curved around the roller.

9. The mobile terminal of claim 8, wherein the roller comprises a plurality of engaging members configured to engage with the plurality of supporting members as the third area of the flexible display unit is curved around the roller.

10. The mobile terminal of claim 7, further comprising a side frame disposed at the first lateral side of the mobile terminal and configured to cover a curved portion of the third area of the flexible display unit curved around the roller.

11. The mobile terminal of claim 1, wherein the third frame is configured to be moved from the third position to the fourth position with respect to the second frame and the second frame is configured to be moved from the first position to the second position with respect to the first frame in response to a force exerted manually by a user.

12. The mobile terminal of claim 1, further comprising a driving unit, wherein the driving unit comprises a motor configured to provide a force to move the third frame from the third position to the fourth position and the second frame from the first position to the second position.

13. The mobile terminal of claim 12, wherein the driving unit further comprises a first bracket coupled to the first frame, a second bracket coupled to the second frame, and a third bracket coupled to the third frame.

14. The mobile terminal of claim 13, wherein the motor is further configured to move the first bracket and third bracket in opposite directions with respect to the second bracket to provide movement of the second frame from the first position to the second position with respect to the first frame and movement of the third frame from the third position to the fourth position with respect to the second frame.

15. A mobile terminal comprising:
a first frame, second frame, and third frame, wherein a slidable two frames of the first, second, or third frames are slidable with respect to a stationary one frame of the first, second, or third frames between respective open positions and closed positions, wherein the third frame is positioned at the rear side of the second frame;
a sliding unit configured to allow the slidable two frames to slide with respect to the stationary one frame between the respective open positions and closed positions;
a flexible display unit comprising:
a first area coupled to a front side of the first frame and facing a front of the mobile terminal;
a second area coupled to the third frame and facing a rear of the mobile terminal; and
a third area between the first area and the second area and continuous with the first area and the second area,
wherein a front portion of the third area facing the front of the mobile terminal increases and a rear portion of the third area disposed at the rear side of the mobile terminal decreases as the slidable two frames are moved from the respective closed positions to the respective open positions with respect to the stationary one frame, wherein the rear portion of the third area facing the rear of the mobile terminal decreases as the front portion of the third area increases, and wherein a curved portion of the third area is positioned between the front portion and the rear portion.

16. The mobile terminal of claim 15, wherein the front portion of the third area is coplanar with the first area.

17. The mobile terminal of claim 15, wherein:
the mobile terminal is in a fully closed state when the slidable two frames are in the respective closed positions with respect to the stationary one frame; and
the mobile terminal is in a fully open state when the slidable two frames are in the respective open positions with respect to the stationary one frame.

18. The mobile terminal of claim 17, wherein:
the first frame comprises a first rear portion and a second rear portion;
the second rear portion is covered by the flexible display unit when the mobile terminal is in the fully closed position; and
the first rear portion comprises a camera and remains exposed when the mobile terminal is in the fully closed position.

19. The mobile terminal of claim 15, further comprising a roller disposed at a first lateral side of the mobile terminal, wherein the third area of the flexible display unit is configured to be curved around the roller.

20. The mobile terminal of claim 19, further comprising a plurality of supporting members aligned parallel to the first lateral side and configured to support the flexible display unit while allowing the third area of the flexible display unit to be curved around the roller.

21. The mobile terminal of claim 20, wherein the roller comprises a plurality of engaging members configured to engage with the plurality of supporting members as the third area of the flexible display unit is curved around the roller.

22. The mobile terminal of claim 21, further comprising a side frame disposed at the first lateral side of the mobile terminal and configured to cover the curved portion of the third area of the flexible display unit curved around the roller.

23. The mobile terminal of claim 15, wherein the slidable two frames are configured to be moved from the respective closed positions to the respective open positions with respect to the stationary one frame in response to a force exerted manually by a user.

24. The mobile terminal of claim 15, further comprising a driving unit, wherein:
the driving unit comprises:
a motor;
a first bracket coupled to the first frame;
a second bracket coupled to the second frame; and
a third bracket coupled to the third frame,
wherein the slidable two frames move between the respective open positions and closed positions with respect to the stationary one frame by operation of the motor.

25. The mobile terminal of claim 24, wherein the motor does not move with respect to the stationary one frame while the slidable two frames are moved with respect to the stationary one frame by operation of the motor.

* * * * *